United States Patent
Maher et al.

(10) Patent No.: US 7,332,374 B2
(45) Date of Patent: Feb. 19, 2008

(54) PREALIGNMENT AND GAPPING FOR RF SUBSTRATES

(75) Inventors: Lawrence J. Maher, Lake in the Hills, IL (US); Robert Churchill, Wauconda, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 114 days.

(21) Appl. No.: 11/270,842

(22) Filed: Nov. 9, 2005

(65) Prior Publication Data

US 2007/0105269 A1 May 10, 2007

(51) Int. Cl.
*H01L 21/76* (2006.01)

(52) U.S. Cl. .......................... 438/113; 257/620

(58) Field of Classification Search ........... 438/517, 438/526–527, 542, 546–549, 551–553, 563, 438/567, 761–762, 765–766, 769–772, 774–778, 438/782–784, 786–788, 6, 10, 104, 107–114, 438/118, 121–123, 128–129, 135, 142, 145, 438/149, 151, 157, 176
See application file for complete search history.

(56) References Cited

U.S. PATENT DOCUMENTS

| | | | |
|---|---|---|---|
| 4,660,280 A * | 4/1987 | Asai et al. ................ | 29/759 |
| 5,111,278 A | 5/1992 | Eichelberger | |
| 5,144,747 A | 9/1992 | Eichelberger | |
| 5,250,843 A | 10/1993 | Eichelberger | |
| 5,841,193 A | 11/1998 | Eichelberger | |
| 5,900,892 A * | 5/1999 | Mantell et al. ............ | 347/45 |
| 5,956,564 A * | 9/1999 | Newman et al. ........... | 438/9 |
| 6,168,971 B1 | 1/2001 | Love et al. | |
| 6,534,378 B1 | 3/2003 | Ramkumar et al. | |
| 6,803,324 B2 | 10/2004 | Ogawa et al. | |
| 2001/0029064 A1 * | 10/2001 | Odajima et al. ........... | 438/113 |
| 2003/0003622 A1 | 1/2003 | Ishizu et al. | |
| 2003/0016273 A1 * | 1/2003 | Sakamoto et al. ......... | 347/68 |
| 2003/0057544 A1 | 3/2003 | Nathan et al. | |
| 2003/0059976 A1 | 3/2003 | Nathan et al. | |
| 2003/0140317 A1 | 7/2003 | Brewer et al. | |
| 2006/0191136 A1 * | 8/2006 | Eldridge et al. .......... | 29/884 |

* cited by examiner

*Primary Examiner*—Michael Lebentritt
*Assistant Examiner*—Andre' Stevenson
(74) *Attorney, Agent, or Firm*—Stetina Brunda Garred & Brucker

(57) ABSTRACT

A method is provided for manufacturing electronic module assemblies comprising a plurality of substrates and a housing. The method comprises providing an alignment plate having a plurality of protrusions disposed through an upper surface thereof, wherein the protrusions are positioned on the alignment plate according to a predetermined substrate layout pattern; positioning the substrates on the alignment plate in between respective ones of the protrusions such that repeatable gaps may be created between the substrates; applying strips of tape over common edges of the substrates to form a sheet of substrates; removing the sheet from the alignment plate; trimming excess tape from the sheet; cleaning the housing and sheet; placing an epoxy preform within the housing; placing the sheet of substrates onto the preform while aligning key artwork from the sheet to housing walls, pins or tabs integrally formed within the housing; securing the sheet of substrates within the housing using spot tape; vacuum curing the module assembly; and removing the tape from the module assembly.

19 Claims, 6 Drawing Sheets

PREALIGNMENT AND GAPPING FOR RF SUBSTRATES

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates to manufacturing processes for electronic modules composed of a plurality of substrates. In particular, the present invention provides a method for manufacturing high performance, high reliability modules (e.g. RF) which utilizes an alignment plate with shims, or the like, for allowing the alignment and assembly of the substrates to be performed in a repeatable and more precise manner.

2. Background of the Invention

Contract awards for high performance, high reliability RF modules are very competitive. Not only are developmental costs being challenged, but the recurring manufacturing costs as well are being challenged. Unique design and process enablers create a market edge, therefore, it is desirable to continually seek out and develop process enhancements which reduce manufacturing costs while simultaneously improving quality.

Two contributors to manufacturing cost are build and test labor. As the complexity of one of these factors increases, usually the other follows. Any variation in the materials and manufacturing processes drives up the test time and in turn the cost. But if an electronic module can be built the same way each time, then it can be tested the same way. Typical build processes for modules are as follows: substrate attach, component attach, and interconnect. Automated equipment and tooling is commonly used to reduce build variation of component attach and interconnect. Additionally, the substrate technology and substrate attach process are dependent on a manufacturer's packaging of the overall RF module design.

A common approach for manufacturing high reliability, high performance RF modules is to attach ceramic substrates into a hermetic sealed housing. The variables that influence the RF performance of this approach are substrate artwork alignment, substrate-to-substrate gaps, and substrate-to-substrate height. Also, a tool is needed to control these variables.

For example, in a typical prior art substrate attach build for RF designs, a precut adhesive film or preform is placed on the floor of the case and substrates are placed on top of it. Each substrate is located one at a time to align the RF lines and provide a minimum gap around each substrate. Another substrate attach process for prior art RF module designs typically uses adhesive paste and shims. The paste and shims are dispensed or manually applied to the housing floor. Next, one or more substrates are placed, one at a time, onto the paste. Each substrate is scrubbed into the paste to promote wetting. Shims are then placed between substrates to create the proper gap. The sides of the substrates are also shimmed to the housing walls so as to align the artworks. After curing, the shims may be removed and any required cleaning is performed.

The aforementioned processes have some disadvantages which could be improved upon. In particular, the alignment is operator dependent; that is to say, the manual placement, alignment and shimming process increases variance in alignment repeatability. Furthermore, manual placement, alignment and shimming is labor intensive.

It would be advantageous and desirable to provide a tool and method of using the tool that could repetitively and accurately pre-align and gap RF substrates utilizing an adhesive film or tape rather than paste. Ideally, a tool, jig or alignment plate could be provided which would move the substrate alignment task away from the preform. As a result of utilizing an alignment plate, the placement and alignment process becomes a repeatable process, while the shimming portion of the process is entirely eliminated, except for during the fabrication of the alignment plate.

BRIEF SUMMARY OF THE INVENTION

The present invention is intended to overcome and solve the aforementioned problems commonly encountered in the production of electronic modules, and in particular with high performance, highly reliable RF modules.

According to the present invention, a method is provided for manufacturing electronic module assemblies wherein each module typically comprises a plurality of substrates and housing. The exemplary method may comprise the steps of providing an alignment plate having a plurality of protrusions disposed through an upper surface thereof wherein the protrusions are positioned on the alignment plate according to a predetermined substrate layout pattern; positioning each of the substrates on the alignment plate in between respective ones of the plurality of protrusions such that repeatable gaps may be created between the substrates; applying strips of tape over common edges of the plurality of substrates to form a sheet of substrates; and removing the sheet of substrates from the alignment plate.

According to further aspects of the present invention, the method may further comprise trimming excess tape from the sheet of substrates as required; plasma cleaning the housing and sheet of substrates; placing an epoxy preform within a floor of the housing; placing the sheet of substrates onto the epoxy preform positioned within the housing while aligning key artwork from the sheet of substrates to at least one of housing pins or tabs within the housing; securing the sheet of substrates within the housing using spot tape; vacuum curing the module assembly; and removing the strips of tape and spot tape from the module assembly. According to another aspect of the present invention, the method further includes attaching a cover to the housing to hermetically seal the sheet of substrates.

Additionally, in another aspect of the present invention the protrusions are generally thin planar shaped shims adapted to be inserted into longitudinal slots formed within the upper surface of the alignment plate. The shims may be generally square shaped, generally rectangular shaped, or have various other shapes which accomplish the same function. In another aspect of the present invention, at least some the protrusions are generally thin shims adapted to be inserted into longitudinal slots formed within the upper surface of the alignment plate, wherein some of the slots adapted to receive the corner shaped shims are formed in an intersecting and perpendicularly oriented manner. In another aspect of the present invention, the protrusions comprise cylindrical rods adapted to be inserted into holes disposed through the upper surface of the alignment plate.

According to other aspects of the present invention, a minimum gap of about 0.003 inch is preferably maintained between each of the plurality of substrates; a minimum gap of about 0.010 inch is preferably maintained between the plurality of substrates and a sidewall of the housing; the slots are preferably cut via a laser to 0.007 inches×0.090 inches; and the alignment plate preferably has a thickness of about 0.100 inches.

According to still further aspects of the present invention, the protrusions protrude upward from the upper surface of the alignment plate by about a ratio of two-thirds the thickness of the sheet of substrates.

According to another embodiment of the present invention, the method is for manufacturing high performance and highly reliable RF modules.

Other exemplary embodiments and advantages of the present invention may be ascertained by reviewing the present disclosure and the accompanying drawings.

BRIEF DESCRIPTION OF THE DRAWINGS

The present invention is further described in the detailed description that follows, by reference to the noted drawings by way of non-limiting examples of preferred embodiments of the present invention, in which like reference numerals represent similar parts throughout several views of the drawings, and in which.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

According to an aspect of the present invention, a system for pre-alignment and gapping substrates is provided. The system includes the use of a tool, jig, or alignment plate that is utilized in combination with a method for pre-aligning and gapping substrates.

First Embodiment of an Exemplary Alignment Plate

Figure 1:
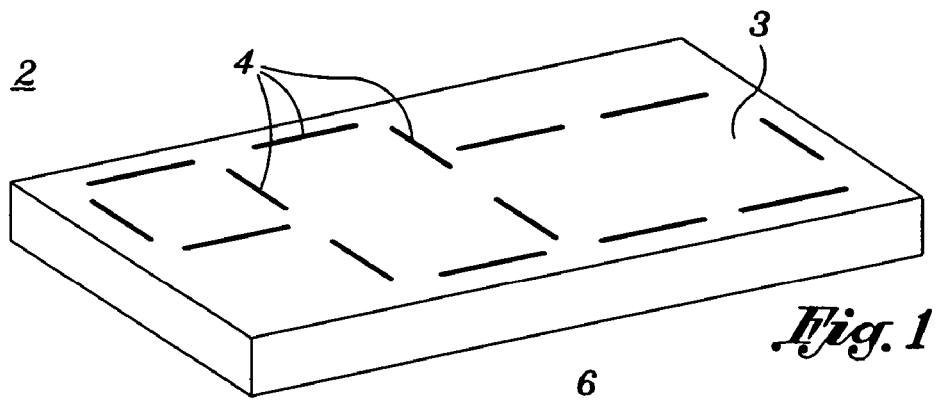
FIG. 1 is a first exemplary embodiment of alignment plate or jig, according to an aspect of the present invention.

FIG. 1 is a first exemplary embodiment of alignment plate or jig 2, according to an aspect of the present invention. The alignment plate 2 may be made of any generally planar material such as wood, particle board, foam, fiberglass, metal, composites, plastic, lexan or any other material known in the art for making tooling, jigs, and/or the like. The upper surface 3 of the alignment plate 2 is adapted to receive substrate components. The upper surface 3 is preferably flat; however, the upper surface may also have cavities, voids, depressions, holes, etc. which are adapted to receive non-flat substrates, components and/or substrates with components. In the instant embodiment being discussed, the alignment plate 2 preferably has a thickness of about 0.100 inches.

An aspect of the present invention is that the alignment plate 2 may be set-up for a production run of numerous units of the same electronic module. In this scenario, it is likely that the alignment plate 2 will be custom built for the specific module design of which the alignment plate 2 is intended to be utilized, such as is shown in FIG. 1.

To manufacture the alignment plate 2, the intended layout of each substrate relative to each other is marked onto the upper surface of the alignment plate 2. When laying out the orientation/positioning of the substrates 8 with respect to each other, a gap of about 0.003 inches is preferably provided between the substrates 8 and a gap of 0.010 is preferably provided between the substrates and the module housing walls. Typically, the layout (not shown) of the substrates 8 relative to each other and the module housing is first drawn up in a CAD system or via conventional drawing methods. To precisely position the slots 4, a new layer (not shown) may be added to the CAD drawings (or conventional drawings) which includes the layout of the slots 4 positioned around each substrate 8. Furthermore, to assist in the positioning of each substrate 8 on the alignment plate 2, the outline of each substrate 8 and key artwork may be laser marked on the upper surface 3 of the alignment plate 2 to assist the operator during the assembly process.

Figure 2:
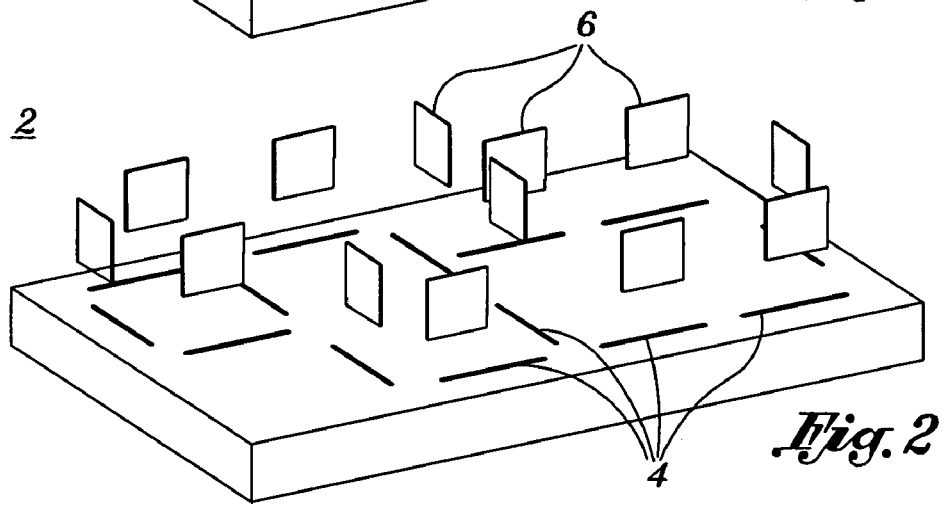
FIG. 2 shows the same alignment plate from FIG. 1, including exemplary planar shims (not installed), according to an aspect of the present invention.

FIG. 2 shows the same alignment plate from FIG. 1, including exemplary planar shims 6 (not installed), according to an aspect of the present invention. The first embodiment of the alignment plate 2 includes various longitudinal slots 4 adapted to receive generally thin and planar square of rectangular shims 6. Once the positions/layout for the slots 4 have been determined, the actual slots 4 may be cut into the planar material chosen for the alignment plate 2. Preferably the slots 4 are laser cut perpendicularly and normal through at least the upper surface of the alignment plate 2. The slots 4 are preferably laser cut 0.007 inches by 0.090 inches through the planar material used to make the alignment plate 2. In the above embodiment, the width of the slot 4 may be any size so long as the shim 6 can be securely (e.g., force-fit) into the slot 4. The slots 4 additionally may be as long as desired. The slots 4 may have a depth which cuts all the way through the alignment plate 2 (see FIG. 4) or of which does not go all the way through the alignment plate 2 (not shown).

Figure 3:
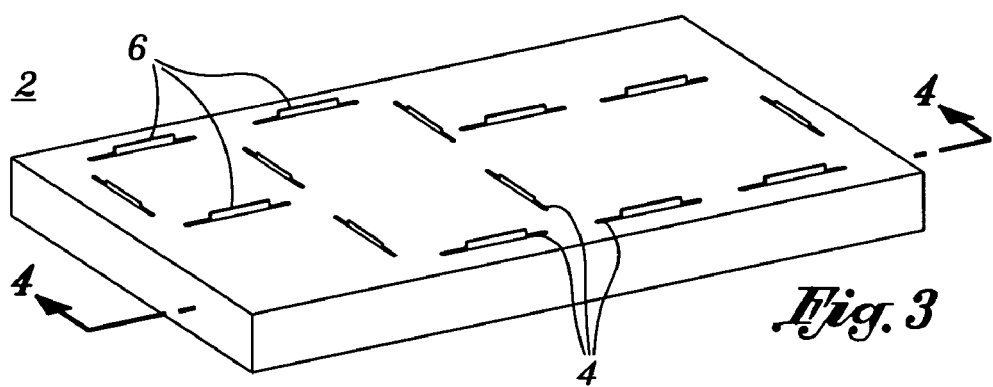
FIG. 3 shows the same alignment plate from FIGS. 1 and 2, including the shims being installed into the alignment plate, according to an aspect of the present invention.
Figure 4:
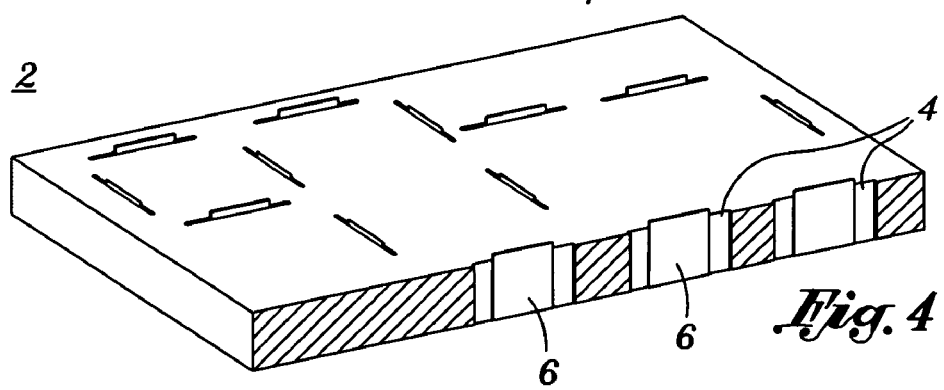
FIG. 4 shows the same alignment plate from FIG. 3 with the shims installed, and further shows a cross-section 4-4, according to an aspect of the present invention.

FIG. 3 shows the alignment plate 2 from FIGS. 1 and 2, including the shims 6 being installed into the plate 2, according to an aspect of the present invention; while FIG. 4 shows the same alignment plate 2 from FIGS. 1 through 3 with the shims 6 installed, and further shows a cross-section 4-4 of a slot 4, according to an aspect of the present invention. Preferably, the shims 6 are configured to only protrude upward about two-thirds of the thickness or height of the various substrates 8. For instance, if the substrates 8 utilized in a module have a thickness of 0.015 inches, then preferably the shims 6 should protrude about 0.010 inches above the surface of the alignment plate 2. Nevertheless, in other circumstances, it may be beneficial to have the shims 6 protrude higher than the substrate 8. Preferably, the shims 6 are force-fit into the slots 4. Additionally, the shims 6 may be permanently installed into the alignment plate 2 by gluing or using adhesive to secure the shim 6 within the slot 4.

Exemplary Method for Using the Alignment Plate to Pre-align and Gap Substrates

FIGS. 5-8 show various steps of the exemplary method for using the alignment plate 2 to pre-align and gap substrates 8, according to an aspect of the present invention. Once the alignment plate 2 has been fabricated and set-up, the process for manufacturing modules may proceed. The method or process may include set-up, populating, taping, trimming, cleaning, assembling, curing and cleaning steps.

Figure 5:
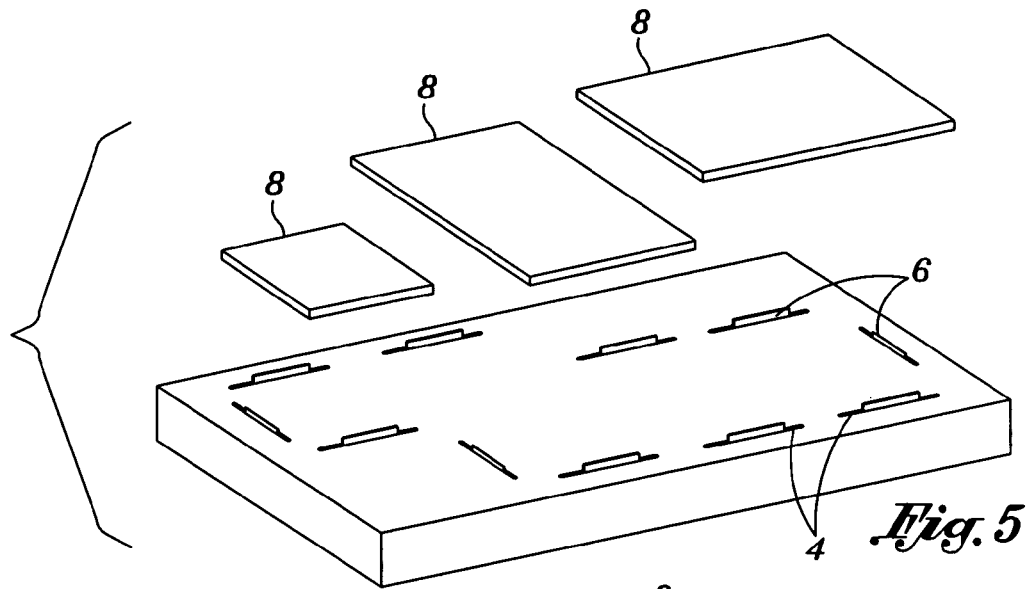
FIG. 5 shows the same alignment plate from FIGS. 1-4, with the shims installed into the alignment plate, and further shows exemplary substrates to be installed into the alignment plate, according to an aspect of the present invention.
Figure 6:
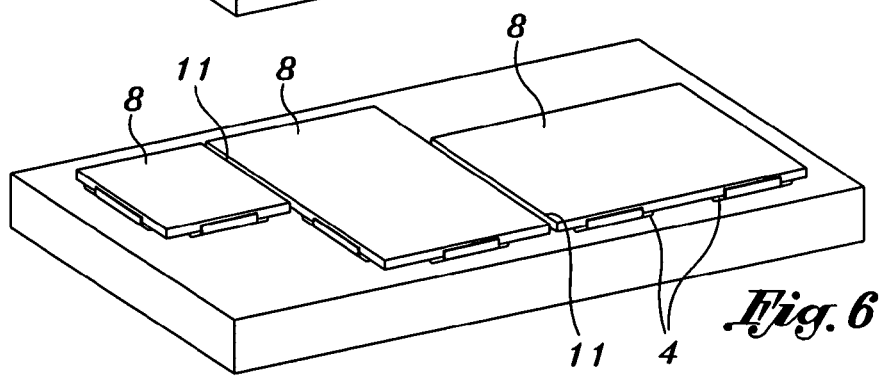
FIG. 6 shows the same alignment plate and substrates from FIG. 5, and further shows exemplary substrates installed into the alignment plate, according to an aspect of the present invention.

FIG. 5 shows the alignment plate 2 with the shims 6 installed, and further shows exemplary substrates 8 to be installed into the alignment plate 2, according to an aspect of the present invention; while FIG. 6 shows the same alignment plate 2 and substrates 8 from FIG. 5, and further shows exemplary substrates 8 installed into the alignment plate 2, according to an aspect of the present invention.

The first step in manufacturing a module includes populating. Populating is defined as placing/positioning the various substrates 8 in between the shims 6, as shown in FIG. 6, such that the desired orientation/placement of substrates 8 with respect to each other is controlled. With the alignment plate 2, the placement of the substrates 8 relative to the shims 6 and other substrates 8 becomes much more repeatable with far less variances with respect to the intended gap tolerances. After the population step is complete (i.e. placing the various substrates between the shims 6), a taping step is initiated.

Figure 7:
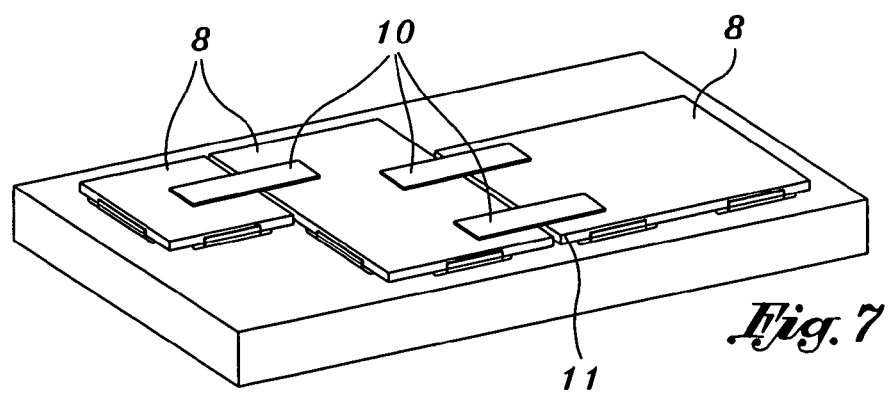
FIG. 7 shows the same alignment plate and substrates from FIG. 7, and further shows exemplary tape applied over the common edges of the substrates forming a "sheet of subs" comprising the individual substrates, according to an aspect of the present invention.

FIG. 7 shows exemplary tape 10 applied over the common edges 11 of the substrates 8 forming a "sheet of subs" 12 comprising the individual substrates 8, according to an aspect of the present invention. The taping step includes taping the substrates 8 together by applying strips of tape 10 or adhesive from substrate 8 to substrate 8. Preferably, a low residue tape 10 is preferred. As a result of the taping step, the relative positions of the substrates 8 may be temporarily locked together relative to each other. It is recognized that various widths of tape 10 may be utilized in the taping step. Preferably tape 10 having a thin width is used since it is easy to handle and reduces time in a following trimming step. In the alternative, a wider roll of tape 10 may be utilized to tape the substrates 8, however, this increases the amount of time required to trim the tape 10 in a following trimming step.

Figure 8:
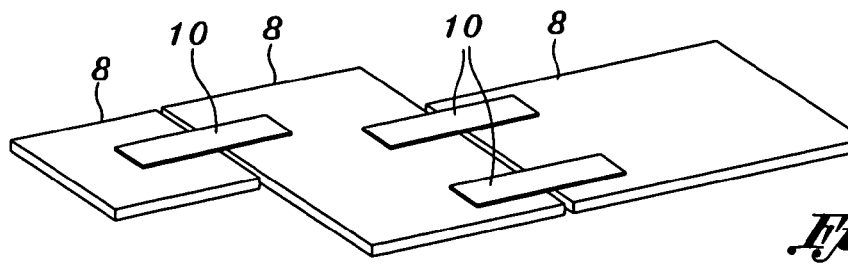
FIG. 8 shows the "sheet of subs" comprising the individual substrates removed from the alignment plate from FIG. 7, according to an aspect of the present invention.

FIG. 8 shows the sheet of substrates 12 (a.k.a., "sheet of subs") comprising the individual substrates 8 removed from the alignment plate 2, according to an aspect of the present invention. After the taping step is complete, a trimming step may be implemented. In this step, the "sheet of subs" 12 is removed from the alignment plate 2, and any excess tape 10 from the taping step is removed as required.

Assembly of the Module

The following section now describes the assembly steps utilized in building an exemplary module 30. First, the sheet of substrates 12, the module housing base 14 in which the sheet of substrates 12 will be positioned within, and housing lid 15 are cleaned. Preferably, the cleaning step is performed by a plasma cleaning system; however, any other method of cleaning known in the art of electronic module assembly may also be employed. Following the first cleaning step is the assembly step.

Figure 9:
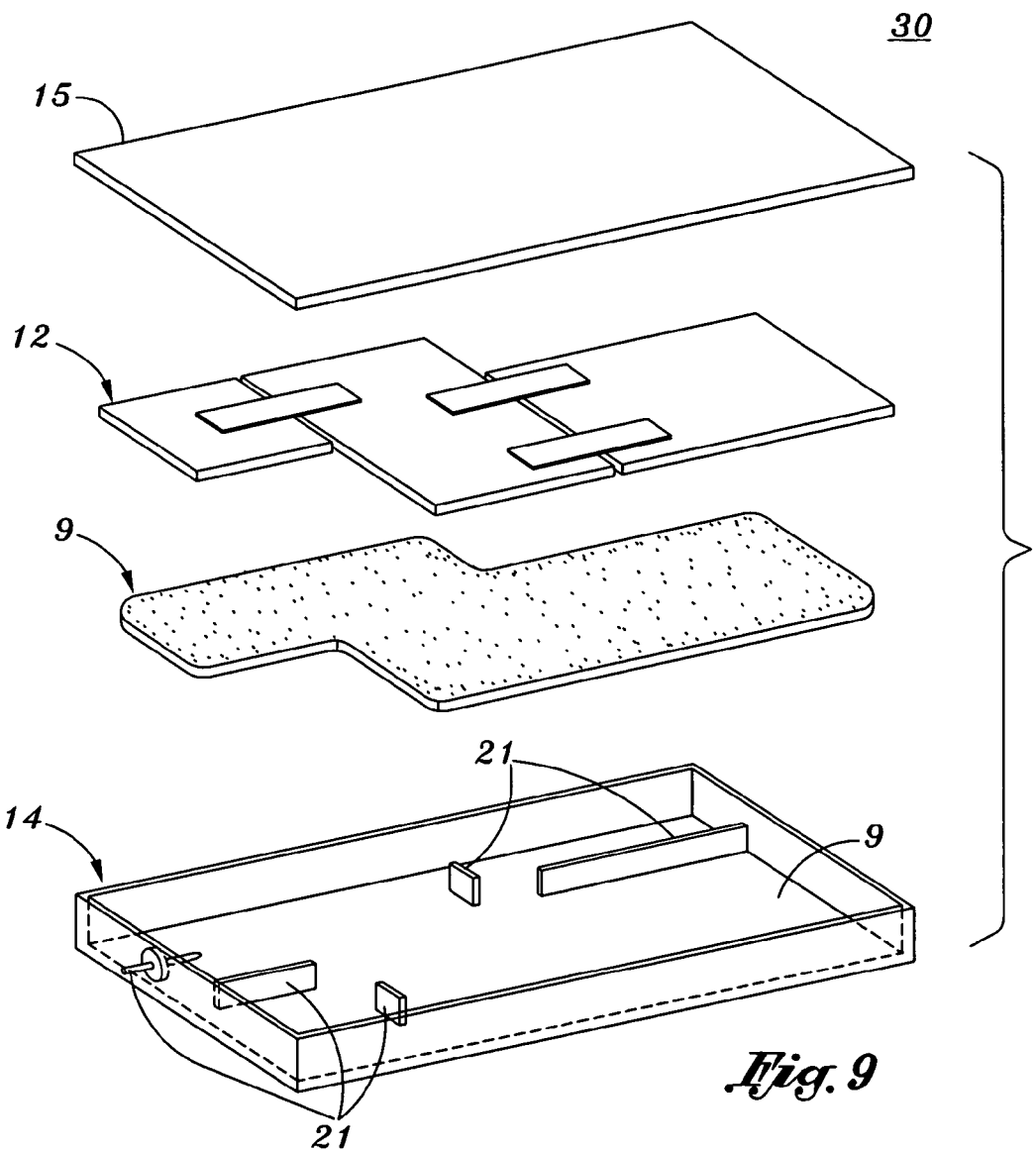
FIG. 9 provides an exploded view of a module assembly comprising a housing, epoxy preform and the "sheet of subs", according to an aspect of the present invention.

FIG. 9 provides an exploded view of a module assembly 30 comprising a housing base 14, housing lid 15, epoxy preform 9, and the "sheet of subs" 12, according to an aspect of the present invention. The housing base 14 typically may include a plurality of internal walls, housing pins or alignment tabs 21 integrally formed thereto, adapted to receive the "sheet of subs" 12, similar in function to that of the alignment plate 2. The housing 14, cover 15 is adapted to hermetically seal the "sheet of subs" 12 from adverse environmental conditions. The following paragraphs will now discuss the assembly steps of the exemplary module assembly 30.

Figure 10:
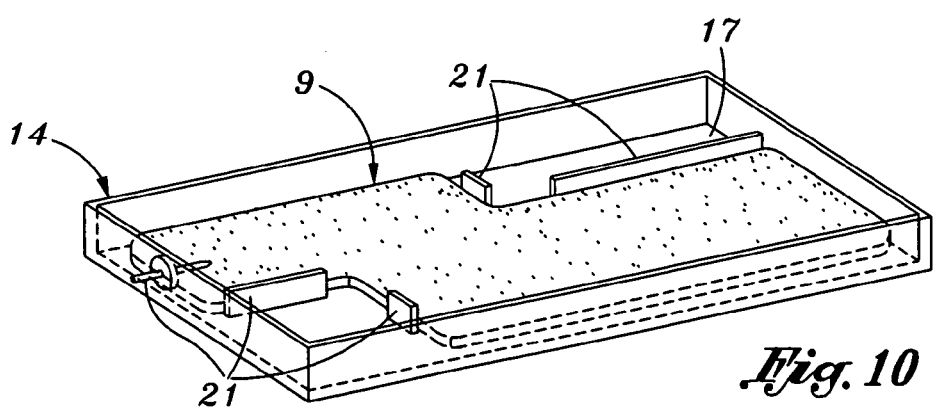
FIG. 10 shows the epoxy preform installed into the housing base, according to an aspect of the present invention.

FIG. 10 shows the epoxy preform 9 installed onto the floor 17 of the housing base 14, according to an aspect of the present invention. The epoxy preform 9 may be cut to conform to the perimeter shape of the "sheet of subs" 12, as is shown in FIG. 10. Or in the alternative, the epoxy preform sheets may be merely segments of epoxy preform sheets 9 positioned on the floor 17 of the housing base 14.

Figure 11:
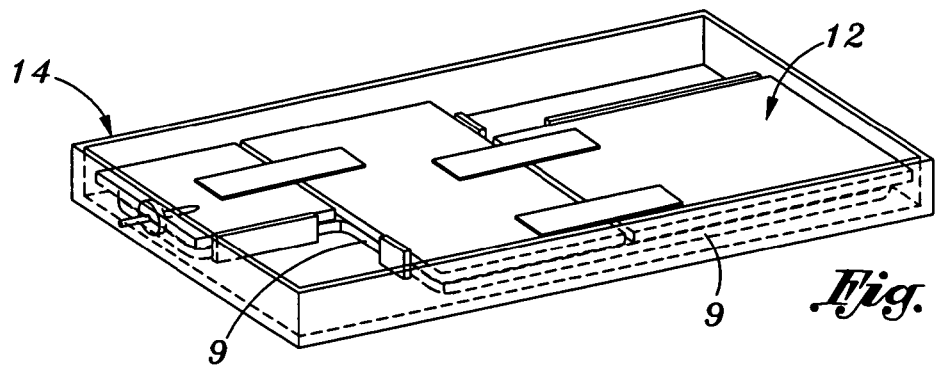
FIG. 11 shows the "sheet of subs" from FIG. 8 installed into the housing base over the epoxy preform, according to an aspect of the present invention.

FIG. 11 shows the "sheet of subs" from FIGS. 8 and 9 installed into the housing base 14 over the epoxy preform 9, according to an aspect of the present invention. As shown in FIG. 11, the "sheet of subs" 12 is adapted to fit within the plurality of internal walls, housing pins or alignment tabs 21 such that the key artwork is aligned with the internal walls, housing pins or alignment tabs 21.

Figure 12:
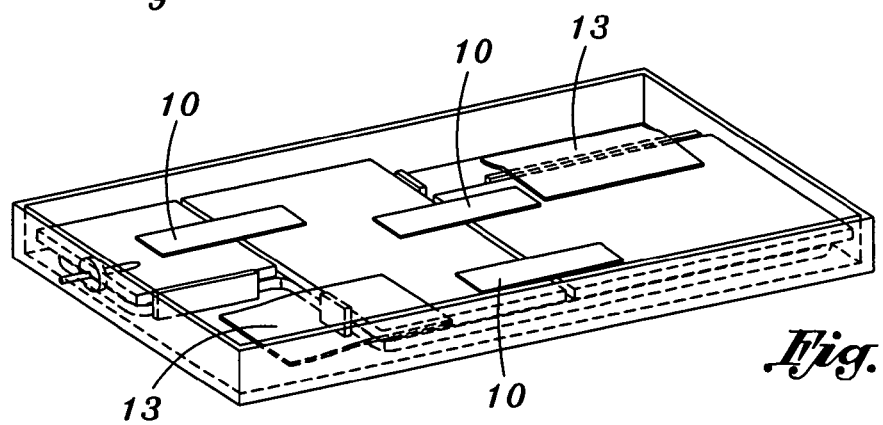
FIG. 12 shows the same "sheet of subs" from FIG. 11 spot taped to the housing base and ready for a vacuum curing step, according to an aspect of the present invention.

FIG. 12 shows the same "sheet of subs" from FIG. 11 spot taped 13 to the housing base 14 such that the sub-assembly is prepared for a vacuum curing step, according to an aspect of the present invention. Next, a curing step is implemented. Preferably, the epoxy preform 9 is allowed to cure under a vacuum. Once the vacuum cure is complete, all the tape 10, 13 is removed from the "sheet of subs" 12 and from the housing base 14.

Figure 13:
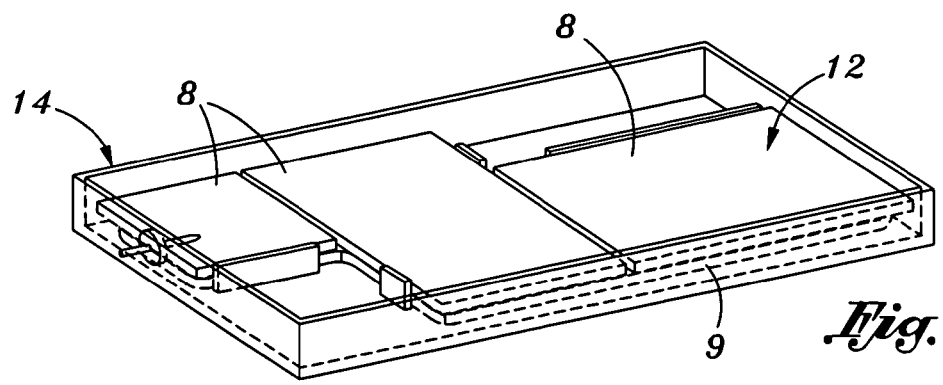
FIG. 13 shows the same "sheet of subs" from FIGS. 11 and 12 after vacuum curing with all tape removed from the "sheet of subs" and from the housing base, according to an aspect of the present invention.

FIG. 13 shows the same "sheet of subs" from FIGS. 11 and 12 after vacuum curing with all tape removed from the "sheet of subs" 12 and from the housing base 14, according to an aspect of the present invention.

Figure 14:
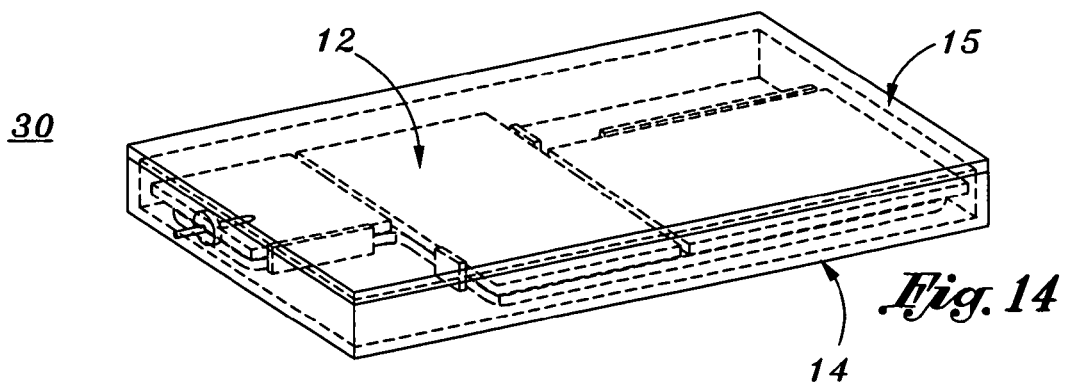
FIG. 14 shows the finally assembly of the module with a cover/lid installed onto the housing base hermetically sealing the "sheet of subs", according to an aspect of the present invention.

And finally, FIG. 14 shows the finally assembly of the exemplary module 30 with the cover 15 installed onto the housing base 14 hermetically sealing the "sheet of subs" 12, according to an aspect of the present invention.

Second Embodiment of an Exemplary Alignment Plate

Figure 15:
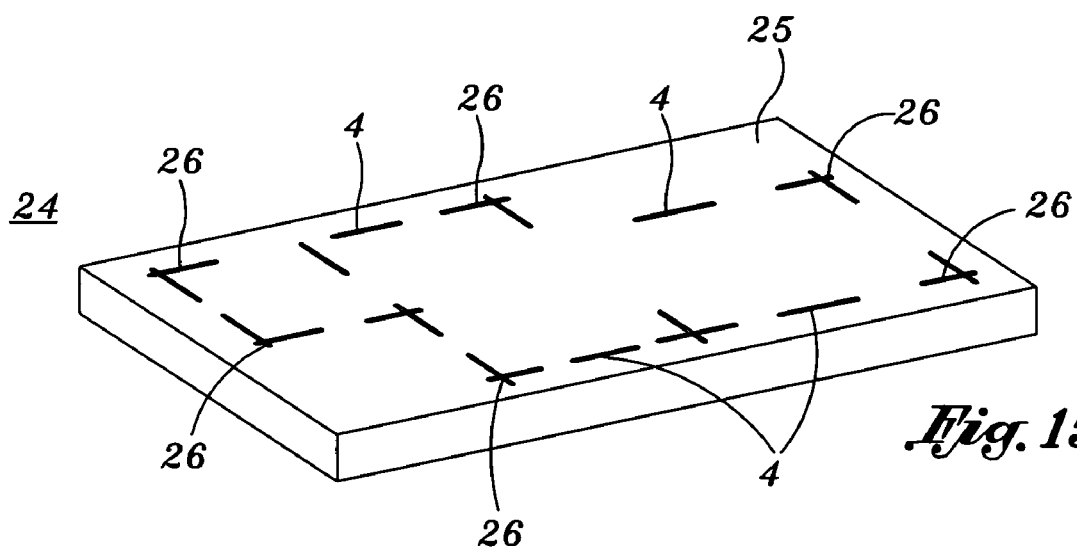
FIG. 15 is a second exemplary embodiment of an alignment plate or jig, according to an aspect of the present invention.
Figure 16:
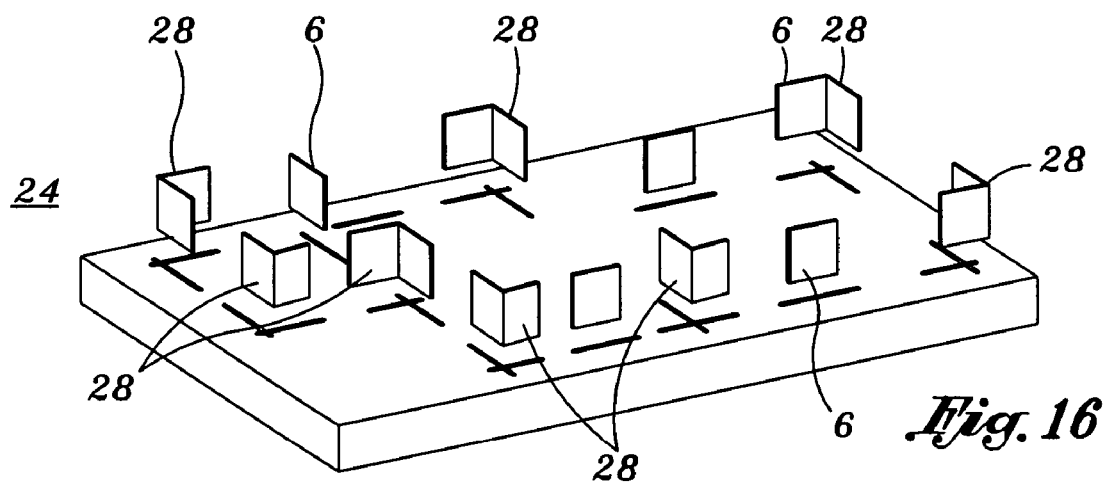
FIG. 16 shows the same alignment plate from FIG. 15, including exemplary framing or corner shims (not installed), according to an aspect of the present invention.
Figure 17:
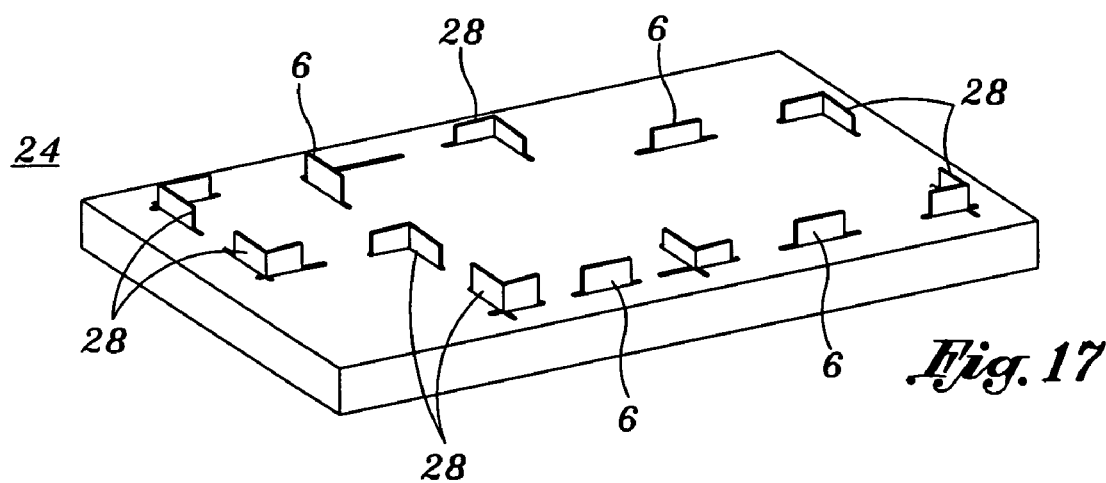
FIG. 17 shows the same alignment plate from FIGS. 15 and 16, including the framing shims being installed into the plate, according to an aspect of the present invention.

FIG. 15 is a second exemplary embodiment of alignment plate or jig 24, according to an aspect of the present invention; FIG. 16 shows the same alignment plate 24 from FIG. 15, including exemplary framing or corner shims 28 (not installed) and planar shims 6, according to an aspect of the present invention; and FIG. 17 shows the same alignment plate 24 from FIGS. 15 and 16, including the corner shims 28 and planar shims 6 being installed into the plate 24, according to an aspect of the present invention.

In particular, the alignment plate 24 is similar to that of the first embodiment alignment plate 2; however, it is adapted to receive and utilize a combination of shims 6 (similar to the first embodiment) and corner shims 28 which are adapted to be installed into corner slots 26. As seen in FIG. 15, the corner slots 26 are formed similar to that of the slots 4, i.e., by intersecting two longitudinal slots together at a perpendicular angle with respect to each other in a crossing manner. Thus, the crossed slots 26 are adapted to receive the generally 90 degree elbow shaped corner shims 28.

Figure 18:
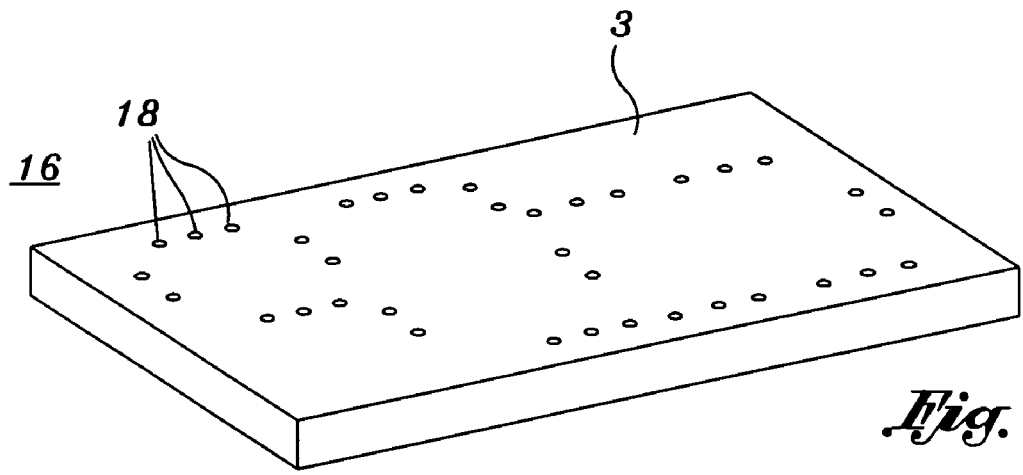
FIG. 18 is a third exemplary embodiment of alignment plate or jig, according to an aspect of the present invention.
Figure 19:
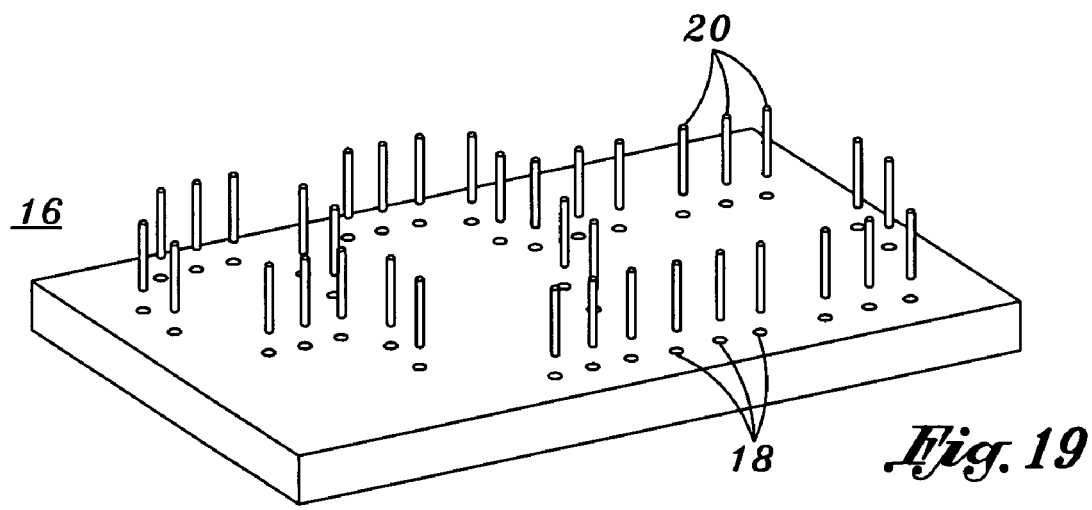
FIG. 19 shows the same alignment plate from FIG. 18, including exemplary dowels, rods or pegs (not installed), according to an aspect of the present invention.
Figure 20:
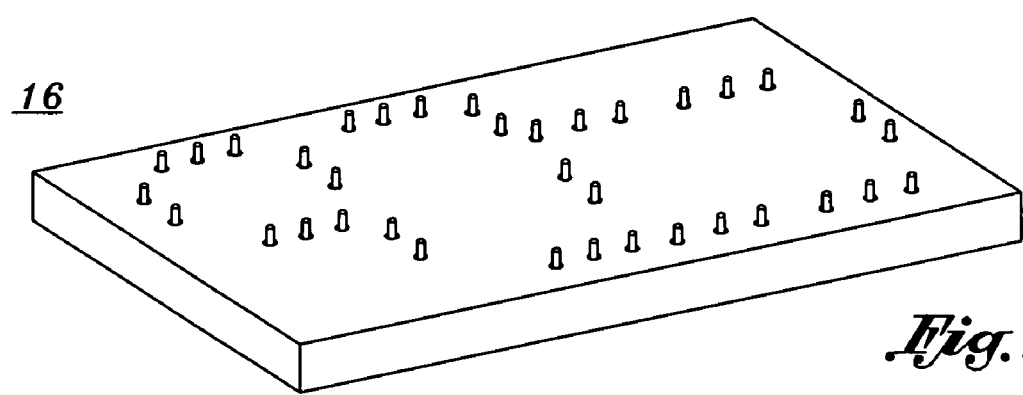
FIG. 20 shows the same alignment plate from FIGS. 18 and 19, including the pegs being installed into the plate, according to an aspect of the present invention.

FIG. 18 is a third exemplary embodiment of alignment plate or jig 16, according to an aspect of the present invention; FIG. 19 shows the same alignment plate 16 from FIG. 18, including exemplary dowels, pegs or rods 20 (not installed), according to an aspect of the present invention; and FIG. 20 shows the same alignment plate 16 from FIGS. 20 and 21, including the pegs 20 being installed into the plate 16, according to an aspect of the present invention.

In particular, in the third exemplary embodiment 16, instead of flat planar rectangular shims 6, cylindrically shaped dowels, pegs or rods 20 are alternatively used. Therefore, instead of forming slots 4 and or corner slots 26 as utilized in the first embodiment and second embodiments, circular holes 18 are formed in the alignment plate 16, preferably by drilling. Preferably, the rods 20 are force-fit into the holes 18. Additionally, the rods 20 may be permanently installed into the alignment plate 16 by gluing or using adhesive to secure the rods 20 within the holes 18.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather, the invention extends to all functionally equivalent structures, methods, and such uses are within the scope of the appended claims.

What is claimed is:

1. A method for manufacturing electronic module assemblies, each module comprising a plurality of substrates and a housing, the method comprising:

providing an alignment plate having a plurality of protrusions disposed through an upper surface thereof, wherein the protrusions are positioned on the alignment plate according to a predetermined substrate layout pattern;

positioning each of the substrates on the alignment plate in between respective ones of the plurality of protrusions such that repeatable gaps may be created between the substrates;

applying strips of tape over common edges of the plurality of substrates to form a sheet of substrates;

removing the sheet of substrates from the alignment plate;

trimming excess tape from the sheet of substrates as required;

plasma cleaning the housing and sheet of substrates;

placing an epoxy preform within a floor of the housing;

placing the sheet of substrates onto the epoxy preform positioned within the housing while aligning key artwork from the sheet of substrates to at least one of housing walls, pins or tabs integrally formed within the housing;

securing the sheet of substrates within the housing using spot tape;

vacuum curing the module assembly; and removing the strips of tape and spot tape from the module assembly.

2. A method for manufacturing electronic module assemblies, each module comprising a plurality of substrates and a housing, the method comprising:

providing an alignment plate having a plurality of protrusions disposed through an upper surface thereof, wherein the protrusions are positioned on the alignment plate according to a predetermined substrate layout pattern, the protrusions being generally thin planar shaped shims adapted to be inserted into longitudinal slots formed within the upper surface of the alignment plate;

positioning each of the substrates on the alignment plate in between respective ones of the plurality of protrusions such that repeatable gaps may be created between the substrates;

applying strips of tape over common edges of the plurality of substrates to form a sheet of substrates; and removing the sheet of substrates from the alignment plate.

3. The method according to claim 2, wherein the shims are generally square shaped.

4. The method according to claim 2, wherein the shims are generally rectangular shaped.

5. The method according to claim 2, wherein at least some of the protrusions are generally thin corner shaped shims adapted to be inserted into longitudinal slots formed within the upper surface of the alignment plate, wherein some of the slots adapted to receive the corner shaped shims are formed in an intersecting and perpendicularly oriented manner.

6. A method for manufacturing electronic module assemblies, each module comprising a plurality of substrates and a housing, the method comprising:
   providing an alignment plate having a plurality of protrusions disposed through an upper surface thereof, wherein the protrusions are positioned on the alignment plate according to a predetermined substrate layout pattern, the protrusions comprising cylindrical rods adapted to be inserted into holes disposed through the upper surface of the alignment plate;
   positioning each of the substrates on the alignment plate in between respective ones of the plurality of protrusions such that repeatable gaps may be created between the substrates;
   applying strips of tape over common edges of the plurality of substrates to form a sheet of substrates; and
   removing the sheet of substrates from the alignment plate.

7. A method for manufacturing electronic module assemblies, each module comprising a plurality of substrates and a housing, the method comprising:
   providing an alignment plate having a plurality of protrusions disposed through an upper surface thereof, wherein the protrusions are positioned on the alignment plate according to a predetermined substrate layout pattern;
   positioning each of the substrates on the alignment plate in between respective ones of the plurality of protrusions such that repeatable gaps may be created between the substrates, wherein a minimum gap of about 0.003 inches is maintained between each of the plurality of substrates;
   applying strips of tape over common edges of the plurality of substrates to form a sheet of substrates; and
   removing the sheet of substrates from the alignment plate.

8. A method for manufacturing electronic module assemblies, each module comprising a plurality of substrates and a housing, the method comprising:
   providing an alignment plate having a plurality of protrusions disposed through an upper surface thereof, wherein the protrusions are positioned on the alignment plate according to a predetermined substrate layout pattern;
   positioning each of the substrates on the alignment plate in between respective ones of the plurality of protrusions such that repeatable gaps may be created between the substrates, wherein a minimum gap of about 0.010 inch is maintained between the plurality of substrates and a sidewall of the housing;
   applying strips of tape over common edges of the plurality of substrates to form a sheet of substrates; and
   removing the sheet of substrates from the alignment plate.

9. The method according to claim 2, wherein the slots are cut via a laser to 0.007 inches×0.090 inches.

10. A method for manufacturing electronic module assemblies, each module comprising a plurality of substrates and a housing, the method comprising:
    providing an alignment plate having a plurality of protrusions disposed through an upper surface thereof, wherein the protrusions are positioned on the alignment plate according to a predetermined substrate layout pattern, and wherein the alignment plate has a thickness of about 0.100 inches;
    positioning each of the substrates on the alignment plate in between respective ones of the plurality of protrusions such that repeatable gaps may be created between the substrates;
    applying strips of tape over common edges of the plurality of substrates to form a sheet of substrates; and
    removing the sheet of substrates from the alignment plate.

11. A method for manufacturing electronic module assemblies, each module comprising a plurality of substrates and a housing, the method comprising:
    providing an alignment plate having a plurality of protrusions disposed through an upper surface thereof, wherein the protrusions are positioned on the alignment plate according to a predetermined substrate layout pattern, and wherein the protrusions protrude upward from the upper surface of the alignment plate by about a ratio of two-thirds the thickness of the sheet of substrates;
    positioning each of the substrates on the alignment plate in between respective ones of the plurality of protrusions such that repeatable gaps may be created between the substrates;
    applying strips of tape over common edges of the plurality of substrates to form a sheet of substrates; and
    removing the sheet of substrates from the alignment plate.

12. A method for manufacturing electronic module assemblies, each module comprising a plurality of substrates and a housing, the method comprising:
    providing an alignment plate having a plurality of protrusions disposed through an upper surface thereof, wherein the protrusions are positioned on the alignment plate according to a predetermined substrate layout pattern, and wherein the protrusions protrude upward from the upper surface of the alignment plate by about a ratio of two-thirds the thickness of the sheet of substrates;
    positioning each of the substrates on the alignment plate in between respective ones of the plurality of protrusions such that repeatable gaps may be created between the substrates;
    applying strips of tape over common edges of the plurality of substrates to form a sheet of substrates; and
    removing the sheet of substrates from the alignment plate;
    wherein the module assemblies comprise high performance, highly reliable RF modules.

13. A method for manufacturing electronic module assemblies, each module comprising a plurality of substrates and a housing, the method comprising:
    providing an alignment plate having a plurality of protrusions disposed through an upper surface thereof, wherein the protrusions are positioned on the alignment plate according to a predetermined substrate layout pattern;
    positioning each of the substrates on the alignment plate in between respective ones of the plurality of protrusions such that repeatable gaps may be created between the substrates;
    applying strips of tape over common edges of the plurality of substrates to form a sheet of substrates;
    removing the sheet of substrates from the alignment plate;
    trimming excess tape from the sheet of substrates as required;

plasma cleaning the housing and sheet of substrates;

placing an epoxy preform within a floor of the housing;

placing the sheet of substrates onto the epoxy preform positioned within the housing while aligning key artwork from the sheet of substrates to at least one of housing walls, pins or tabs integrally formed within the housing; and securing the sheet of substrates within the housing using spot tape.

14. The method according to claim 13, wherein the protrusions are generally thin planar shaped shims adapted to be inserted into longitudinal slots formed within the upper surface of the alignment plate.

15. The method according to claim 14, wherein the shims are generally square shaped.

16. The method according to claim 14, wherein the shims are generally rectangular shaped.

17. The method according to claim 14, wherein at least some of the protrusions are generally thin corner shaped shims adapted to be inserted into longitudinal slots formed within the upper surface of the alignment plate, wherein some of the slots adapted to receive the corner shaped shims are formed in an intersecting and perpendicularly oriented manner.

18. The method according to claim 13, wherein the protrusions comprise cylindrical rods adapted to be inserted into holes disposed through the upper surface of the alignment plate.

19. The method according to claim 13, wherein the protrusions protrude upward from the upper surface of the alignment plate by about a ratio of two-thirds the thickness of the sheet of substrates.

* * * * *